United States Patent [19]
Tanaka et al.

[11] Patent Number: 5,086,471
[45] Date of Patent: Feb. 4, 1992

[54] GAIN-SHAPE VECTOR QUANTIZATION APPARATUS

[75] Inventors: Yoshinori Tanaka, Kawasaki; Tomohiko Taniguchi, Yokohama; Fumio Amano, Tokyo; Yasuji Ohta, Yokohama; Shigeyuki Unagami, Atsugi, all of Japan

[73] Assignee: Fujitsu Limited, Kawasaki, Japan

[21] Appl. No.: 545,609

[22] Filed: Jun. 29, 1990

[30] Foreign Application Priority Data

Jun. 29, 1989 [JP] Japan ................. 1-167397

[51] Int. Cl.$^5$ ............................. G10L 5/00
[52] U.S. Cl. ......................... 381/36; 381/31
[58] Field of Search ................. 381/29–40; 364/513.5

[56] References Cited

U.S. PATENT DOCUMENTS

| | | | |
|---|---|---|---|
| 3,631,520 | 12/1971 | Atal | 364/513.5 |
| 4,133,976 | 1/1979 | Atal et al. | 381/47 |
| 4,220,819 | 9/1980 | Atal | 381/38 |
| 4,472,832 | 8/1984 | Atal et al. | 381/40 |
| 4,797,925 | 1/1989 | Lin | 381/31 |
| 4,817,157 | 3/1989 | Gerson | 381/40 |
| 4,868,867 | 9/1989 | Davidson et al. | 381/36 |
| 4,922,508 | 5/1990 | Moriya | 375/34 |
| 4,956,871 | 9/1990 | Swaminathan | 381/31 |
| 4,969,192 | 11/1990 | Chen et al. | 381/31 |
| 4,975,958 | 12/1990 | Hanada et al. | 381/36 |

FOREIGN PATENT DOCUMENTS

| | | |
|---|---|---|
| 0314018 | 10/1988 | European Pat. Off. . |
| 63-31222 | 2/1987 | Japan . |
| 63-87034 | 4/1988 | Japan . |
| 1-191510 | 8/1989 | Japan . |
| 1-243098 | 9/1989 | Japan . |

OTHER PUBLICATIONS

Sabin et al., "Product Code Vector Quantizers for Waveform and Voice Coding", IEEE Transactions on Acoustics, Speech, and Signal Processing, vol. AS-SP-32, No. 3, pp. 474–488, 1984.
Saitoh et al., "Gain/Shape Vector Quantizer for Multidimensional Spherically Symmetric Random Source", Electronics and Communications in Japan, Part I, vol. 69, No. 8, pp. 102–111, 1986.
Schroeder, M. R. and Atal, B. S., "Code-Excited Linear Prediction(CELP): High-Auality Speech At Very Low Bit Rates" pp. 937–940, Proceedings of ICASSP'85.
Davidson, G. and Gerso, A., "Complexity Reduction Methods For Vector Excitation Coding" pp. 3055–3058, Proceedings of ICASSP'86.

*Primary Examiner*—Dale M. Shaw
*Assistant Examiner*—Michelle Doerrler
*Attorney, Agent, or Firm*—Staas & Halsey

[57] ABSTRACT

A gain-shape vector quantization apparatus for compressing the data of voice signal. A code book portion is constituted by a plurality of shape vectors which produce a plurality of selected shape vectors. A plurality of variable gain circuits impart gains to each shape vector produced from the code book portion. A plurality of synthesis filters regenerate signals from the outputs of the variable gain circuits. An adder adds the signals regenerated by the synthesis filters. An evaluation unit produces an index to select a plurality of shape vectors in the code book portion in order to minimize an error between the output of the adder and an input speech signal and further produces gain adjusting signal for the variable gain circuits.

4 Claims, 7 Drawing Sheets

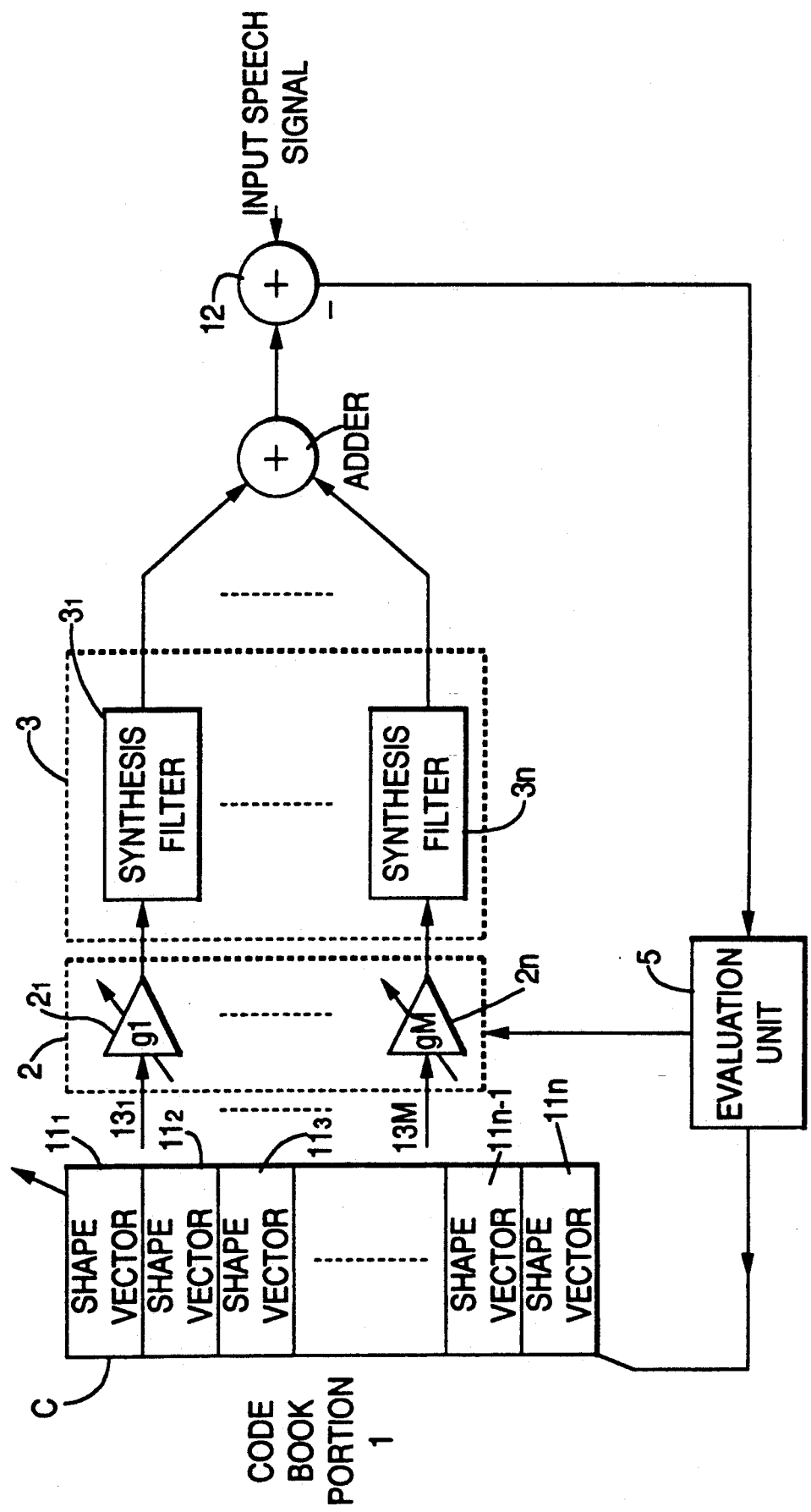

VECTOR QUANTIZATION WITH
TWO SHAPE VECTORS
(IN TWO DIMENSIONAL PHASE)

VECTOR QUANTIZATION WITH
SINGLE SHAPE VECTOR
(IN TWO DIMENSIONAL PHASE)

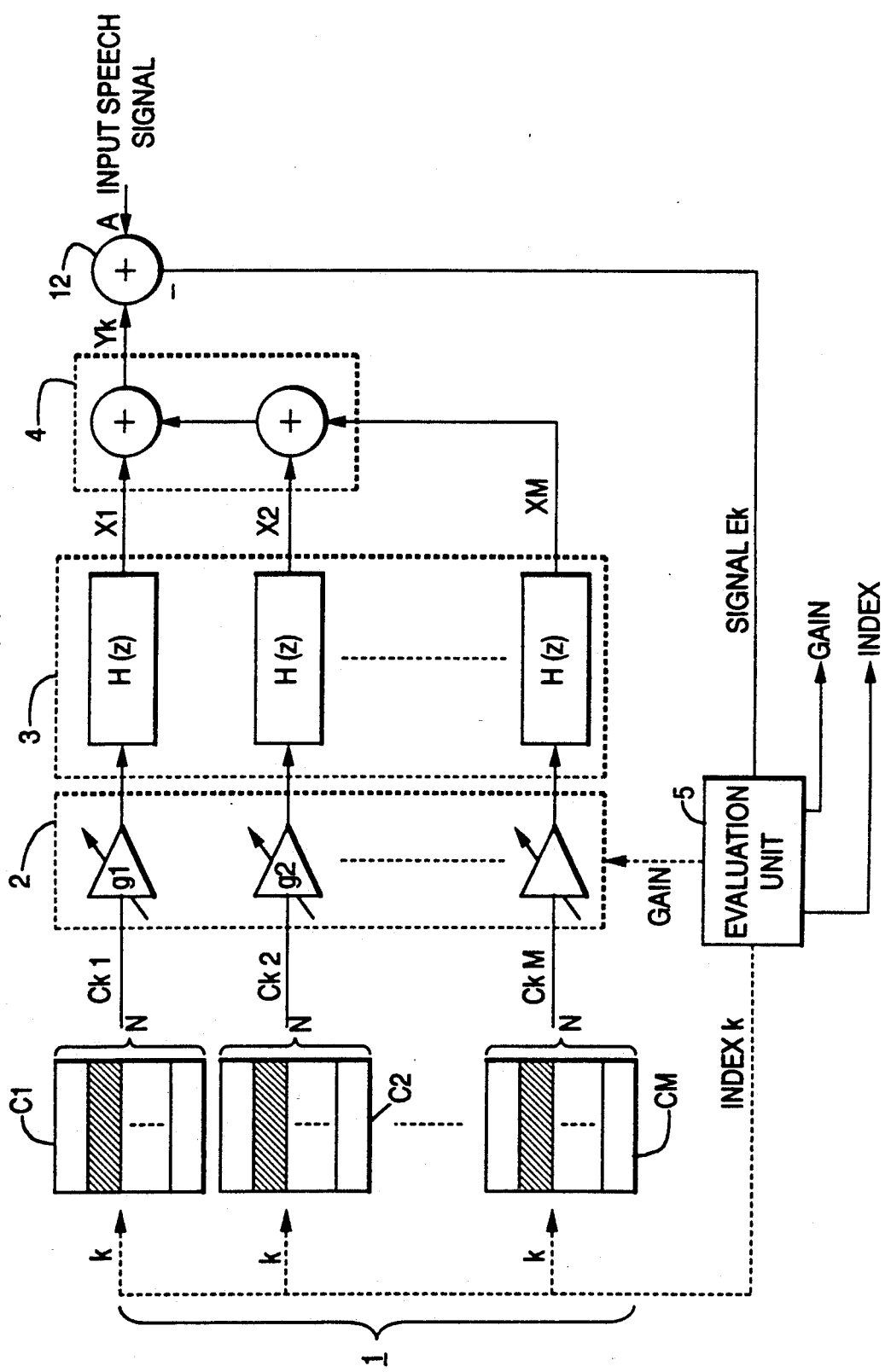

CONSTRUCTION OF DECODING DEVICE

1

GAIN-SHAPE VECTOR QUANTIZATION APPARATUS

BACKGROUND OF THE INVENTION

1. Field of the Invention

The present invention relates to a gain-shape vector quantization apparatus, and particularly to a gain-shape vector quantization apparatus for compressing the data of speech signals.

In recent years, a vector quantization system for compressing the data of speech signals yet maintaining the quality thereof has been employed for communication systems within companies and for digital mobile wireless systems or the like. As is well known, the vector quantization system consists of passing signal vectors of a code book through a synthesis filter to reproduce signals, and evaluating error electric powers between the reproduced signals and the input speech signals in order to determine the index of a signal vector having the smallest error. Among a variety of such vector quantization systems, attention has now been given particularly to a gain-shape (amplitude-phase) vector quantization system used as a high quality speech coding method.

2. Description of the Related Art

FIG. 1 illustrates the constitution of a conventional gain-shape vector quantization apparatus according to which a shape vector (phase) is selected out of shape vectors obtained by normalizing electric power of a plurality of vectors that constitute a code book 11 having a size S and a dimension (or order) L, and multiplied by a gain (amplitude) through a variable gain circuit 12 to separate an amplitude component from a phase component. Then, a signal X is reproduced through a synthesis filter 13 that includes a pitch synthesis filter 13a and an LPC (linear predictive coding) synthesis filter 13b. The synthesis filter 13 has a transfer function H(Z). An error E between the reproduced signal X and the input signal A is evaluated by an evaluation unit 14, whereby a shape vector Ck in the code book 11 is newly selected such that the error E becomes the smallest according to the following equations (1) and (2), $$|Ek|^2 = (A - Xk)^2 \quad (1)$$
$$Xk = H \cdot (g \cdot Ck) \quad (2)$$
$$(k = 1, 2, \ldots, S)$$

Furthermore, the gain g for a shape vector is determined based on the error electric power of E, the gain being calculated for each shape vector.

Then, the index of the shape vector of the code book 11, gain of the variable gain circuit 12, pitch delay of pitch prediction coefficients the pitch synthesis filter 13a, and LPC coefficient of when the input voice is analyzed through an LPC analyzer 15, which are obtained as described above, are transmitted to compress the speech data. According to such a conventional gain-shape vector quantization system, however, there exists only one code book, and only one shape vector is selected from the code book by the evaluation unit resulting in an increase in the quantization distortion (quantize error) and making it difficult to maintain quality of the reproduced speech.

Such a quantization distortion can be decreased by increasing the number of code vectors (shape vectors) included in the code book and by increasing the dimension of the code book. However, the amount of operation for finding an optimum shape vector increases, too, with the increase in the size of the code book, and increased memory is required for storing the shape vectors, posing a serious hindrance for realizing the hardware and causing the amount of shape vector index transmission to increase.

When the size of the code book is decreased to quicken the speed of operation, on the other hand, the reproduced speech loses quality due to quantization error.

SUMMARY OF THE INVENTION

An object of the present invention therefore is to realize a gain-shape vector quantization apparatus which is capable of decreasing the quantization distortion at the time of reproducing the speech without increasing the size of the code book.

In order to attain the above-mentioned object, the present invention deals with a gain-shape vector quantization apparatus which comprises:

a code book portion which contains a plurality of shape vectors and which produces a plurality of shape vectors upon receipt of an index signal;

a gain circuit portion constituted by a plurality of variable gain circuits that impart predetermined gains to the plurality of shape vectors which are produced from the code book portion;

a synthesis filter portion constituted by a plurality of synthesis filters that reproduce signals from the outputs of the variable gain circuits in the gain circuit portion;

a first adder portion which adds the signals reproduced by the synthesis filters in the prediction filter portion;

a second adder portion which adds the output of the adder portion and the input speech signal; and an evaluation unit which determines an index that selects a plurality of shape vectors stored in the code book in order to minimize the error between the output of the first adder portion and the input speech signal, processed in the second adder portion, and supplies it to the code book portion.

BRIEF DESCRIPTION OF THE DRAWINGS

The above object and features of the present invention will be more apparent from the following description of the preferred embodiments with reference to the accompanying drawings, wherein:

FIG. 2 is a block diagram illustrating the principle and construction of a gain-shape vector quantization apparatus according to the present invention;

FIGS. 4, 5A and 5B are block diagrams illustrating gain-shape vector quantization apparatuses according to embodiment of the present invention.

DESCRIPTION OF THE PREFERRED EMBODIMENTS

Figure 1:
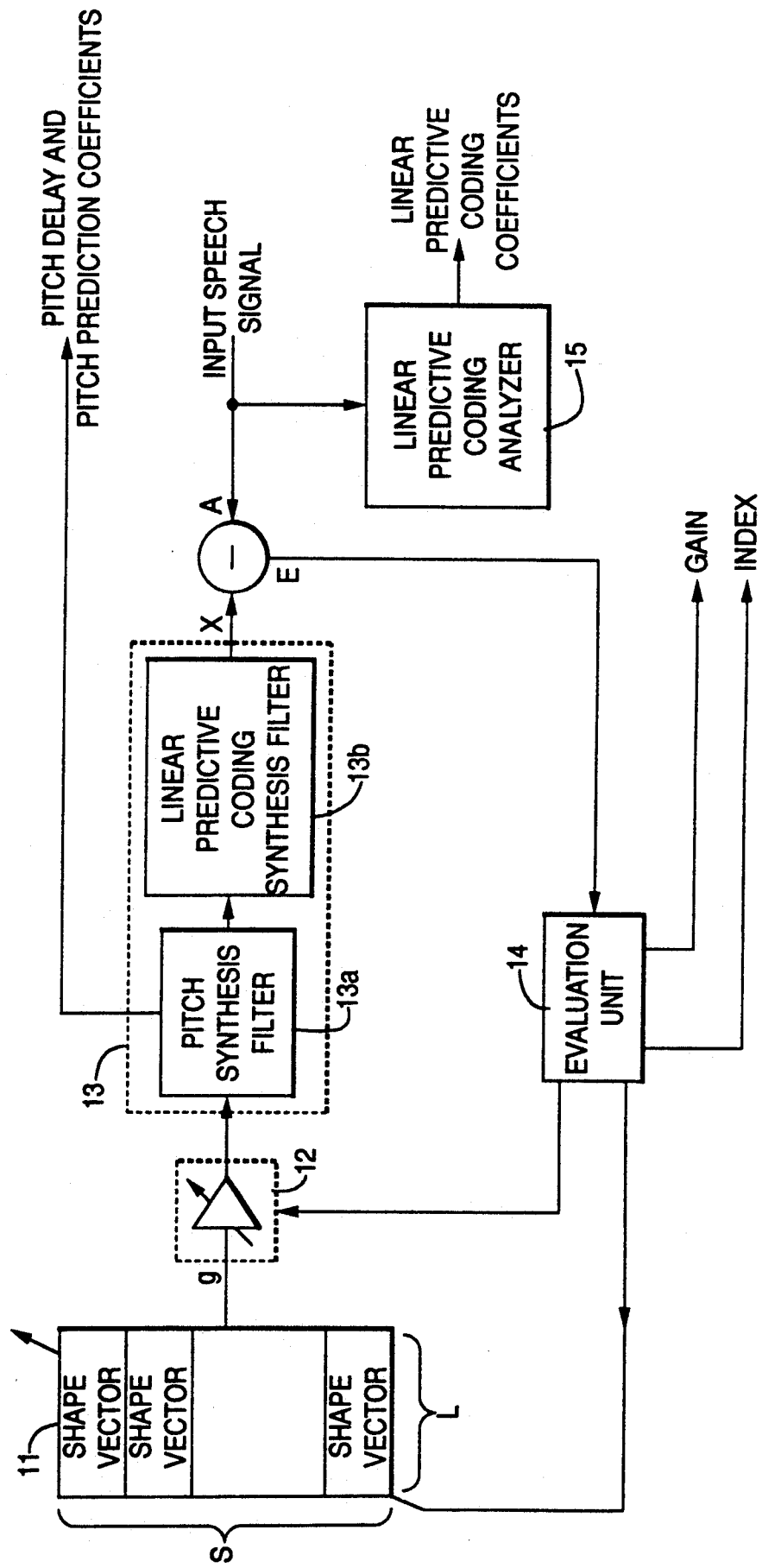
FIG. 1 is a block diagram illustrating the construction of a conventional gain-shape vector quantization apparatus.

The basic technical structure of the gain-shape vector quantization apparatus of the present invention consists of compressing the data. Using a reduced number of indexes or, preferably, a single index, the compression decreases the number of bits, yet maintains vector data in an amount sufficient for maintaining the same quality as that of the conventional apparatus during the operation. Concretely speaking, the operation is carried out while permitting a plurality of shape vector data to be produced in response to a single index data.

The basic technical concepts of the present invention will now be described with reference to FIG. 2 starting, first, with the principles thereof. Referring to FIG. 2 which shows the constitution in principle, the apparatus comprises a code book portion 1 which is constituted by a plurality of shape vectors $11_i$ (i=1-N) and produces a plurality of selected shape vectors, a plurality of variable gain circuits 2 that impart gains to the shape vectors produced from the code book portion 1, a plurality of synthesis filters 3 that reproduce signals from the outputs of the variable gain circuits 2, a first adder 4 that adds up the signals reproduced by the synthesis filters 3, a second adder 12 that adds up the output of the first adder 4 and the input speech, and an evaluation unit 5 that selects a plurality of shape vectors in the code book portion 1 in response to an index such that the error between the output of the first adder 4 and the input speech becomes the smallest.

According to the present invention in this case, the code book portion 1 may be constituted by code books C of a number M, each code book C being constituted by shape vectors of a number N (N>1).

In the gain-shape vector quantization apparatus of the present invention, the code book portion 1 includes at least one code book C which may be a conventionally known one. Each code book C in the code book portion 1 contains a plurality (N) of shape vectors $11_i$ (i=1−N), each of the shape vectors $11_i$ having a vector structure expressed by any random numbers and being stored therein in the form of digital values.

Further, though there is no particular limitation on the length of the shape vectors, i.e., in the dimension, a preferred example is a forty-dimensional one. The code book portion 1 used in the present invention receives an index data from the evaluation unit 5 that will be described later and produces a plurality of shape vectors $13i$ (i=1-M) simultaneously. That is, according to the present invention, a lot of data are obtained from small amounts of data.

As described above, the shape vectors simultaneously produced from the code book portion 1 in response to an index data, pass through pairs of the variable gain circuits $2_i$ (i=1-M) in the gain circuit portion 2 arranged for each of the shape vectors $13_i$ (i=1−M) and the synthesis filter circuits $3_i$ (i=1−M) in the prediction filter portion 3 so as to be reproduced into the original signals, and are then input to the first adder 4 which forms a synthesized vector of reproduced speech. Next, the reproduced synthetic vector is added to a vector of practical speech input from an external unit at the second adder 12, thereby to find an error between the two, and the result is input to the evaluation unit 5 which may be constituted as a unitary structure together with the second adder.

The evaluation unit 5 executes the operation for all shape vectors $11_i$ (i=1−N) stored in the code book C in the code book portion 1 such that the error calculated by the second adder 12 will become the smallest, selects plural combinations of optimum shape vectors, and sends them as index data to the code book portion 1. In this case, though the number of index data is only one, the instruction is given so that a plurality of shape vectors are produced simultaneously from the code book portion 1. For this purpose, a table is prepared in advance to impart index data for plural combinations of all shape vectors, operation is carried out by the evaluation unit 5 for all of these combinations to find a combination that makes the error smallest, and an index of the combination of shape vectors that makes the error the smallest is produced. The same table is also possessed in the code book portion 1, and a required combination of a plurality of shape vectors is produced based upon the index data from the evaluation unit 5.

In the present invention, there is no particular limitation in the number of shape vectors that constitute combinations of shape vectors.

Next, the evaluation unit 5 is so constituted as to supply gain adjusting signals to change the gains of the plurality of variable gain circuits $2_i$ (i=1-M) that constitute the gain circuit portion 2. The gain adjusting signals are to so change the gains of the variable gain circuits that the error in the second adder 12 will become the smallest.

That is, in the present invention, the error of the synthesized speech signal from the input speech signal is minimized by selectively adjusting the shape vectors 11 which are the data related to phase, so that a synthesized vector having a small phase difference is obtained, adjusting the gains that are related to the amplitude. This is to reproduce synthetic speech which is as close to the original speech as possible.

That is, the present invention reproduces the vector which is synthesized from a plurality of shape vectors unlike the conventional art in which a single shape vector in a single code book is used.

Figure 3B:
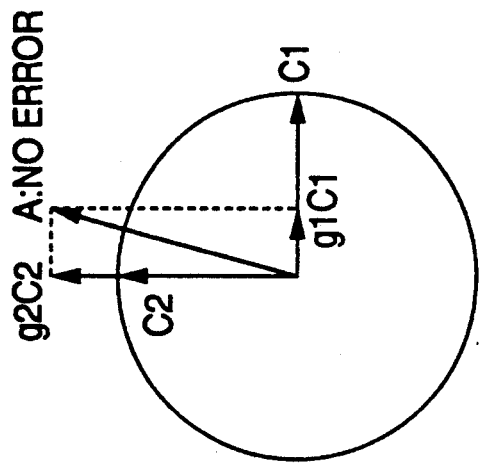
FIGS. 3(a) and 3(b) are diagrams illustrating the principle of vector quantization using a synthesized vector of a plurality of shape vectors.
Figure 3A:
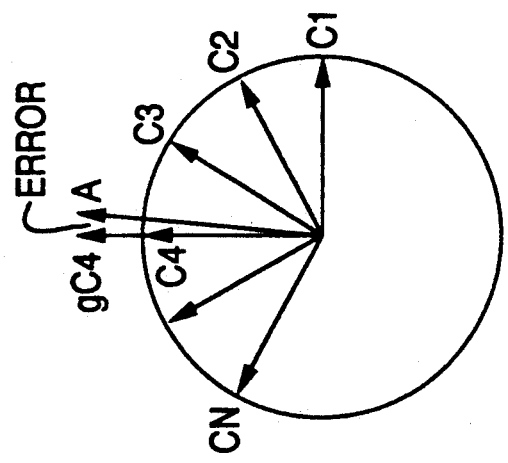

FIG. 3(a) and FIG. 3(b) show the principle of vector quantization according to the present invention for a two-dimensional case.

First, in the case of the conventional vector quantization using a single vector shown in FIG. 3(a), a shape vector $C_4$ is selected out of finite shape vectors $C_1$ to $C_N$ to minimize the quantization distortion with respect to the speech input A that is to be quantized when the shape vectors are multiplied by a scalar g related to a variable gain.

In this case, the number of shape vectors stored in the code book is finite. To reduce the quantization error, it is required to increase the code book size, which results in increasing computational complexity.

On the other hand, FIG. 3(b) shows an example of quantization when the apparatus according to the present invention is used, wherein two shape vectors are used to quantize the two-dimensional vector A.

That is, as shown in FIG. 3(b), the two independent two-dimensional shape vectors $C_1$, $C_2$ are multiplied by gains $g_1$ and $g_2$ to weight them, and the input speech A is quantized by the synthesized vector. In this case, the gains $g_1$, $g_2$ are so adjusted as to correctly realize any vectors. That is, the error can be brought to zero.

Here, what can be quantized without distortion is the case where the number of independent shape vectors used for the synthesis is greater than the number of dimensions of the shape vectors. Even when this condition is not satisfied, however, the quantization distortion can be more decreased with the vector quantization based on a plurality of shape vectors than with the vector quantization based on a single shape vector.

When the two-dimensional vectors are to be quantized as will be obvious from the foregoing description, it is desired that the two shape vectors that are selected are at right angles to each other. That is, in the present invention, when an index is given to the code book portion 1 from the evaluation unit 5 based on an error between the reproduced speech and the input speech, a plurality of shape vectors $11_1$, $11_2$ are selected and produced from the code book portion 1. The shape vectors are then weighted through the corresponding variable gain circuits $2_1$, $2_2$ and, then, signals are reproduced from the prediction filters $3_1$, $3_2$ to effect quantization with little distortion.

FIG. 4 illustrates a concrete embodiment of the code book portion 1 which produces a plurality of shape vectors based on an index data according to the present invention.

In the concrete embodiment of FIG. 4, the code book portion 1 is divided into M code books ($C_1$, $C_2$, ..., $C_M$), each code book being constituted by N (N>1) shape vectors.

The system shown in FIG. 4 will be described in further detail. Reference is made independently to M code books $C_1$, $C_2$, ..., $C_M$ each consisting of N shape vectors, in response to an index produced from the evaluation portion 5, and whereby M code shape vectors ($C_{k,1}$, $C_{k,2}$, ..., $C_{k,M}$) are produced from the code book portion 1.

That is, when the evaluation unit 5 produces an index k that so instructs that a k-th shape vector is selected from each of the code books C, there are produced k-th shape vectors ($C_{k,1}$, $C_{k,2}$, ..., $C_{k,M}$) that are stored in M code books $C_1$, $C_2$, ..., $C_M$ respectively. In this case, the shape vectors stored in the code books are different from one another, and hence, M shape vectors are selected to form vectors that are all different from one another. In this embodiment, the number of code books C is determined depending upon the reproduced speech quality that are to be required. The plurality of shape vectors thus selected are multiplied by a weighting coefficient $g_k$, are processed through the synthesis filter 3, and are added together through the first adder 4 to obtain a synthesized shape vector $Y_k$, $$Y_k = g_1 \cdot H \cdot C_{k,1} + g_2 \cdot H \cdot C_{k,2} + \ldots + g_M \cdot H \cdot C_{k,M} \quad (3)$$

An error is found between this synthesized vector $Y_k$ and the input speech A to be quantized, and an index that minimizes the square error in the evaluation unit 5 and a gain vector G at that moment, $$G = (g_1, g_2, \ldots, g_M) \quad (4)$$

are transmitted.

Then, even when the code books have a small size, the vector $Y_k$ expressed by a linear combination of shape vectors $C_{k,1}$ $C_{k,2}$, ..., $C_{k,M}$ represents any vector in partial space including shape vectors $C_{k,1}$, $C_{k,2}$, ..., $C_{k,M}$ as shown in FIG. 3(b), which is substantially equal to the code book of an increased size.

Therefore, when the quantization distortion equal to that of the conventional large codebook system is acceptable, then the code books may have a size smaller than that of the conventional system.

Though FIG. 4 shows a circuit on the transmitting side only in the communication system, the circuit, in practice, is also constituted in the same manner on the receiving side. Namely, when a gain data and an index data determined by the evaluation unit 5 are transmitted, the receiving side selectively adjusts the code book portion 1 and the gain circuit portion 2 that includes variable gain circuits in response to these data, and reproduces a synthesized voice.

In the aforementioned embodiment, the code book portion is equipped with a plurality of code books ($C_1$ to $C_M$) to generate a plurality of shape vectors in response to an index data.

Figure 5A:
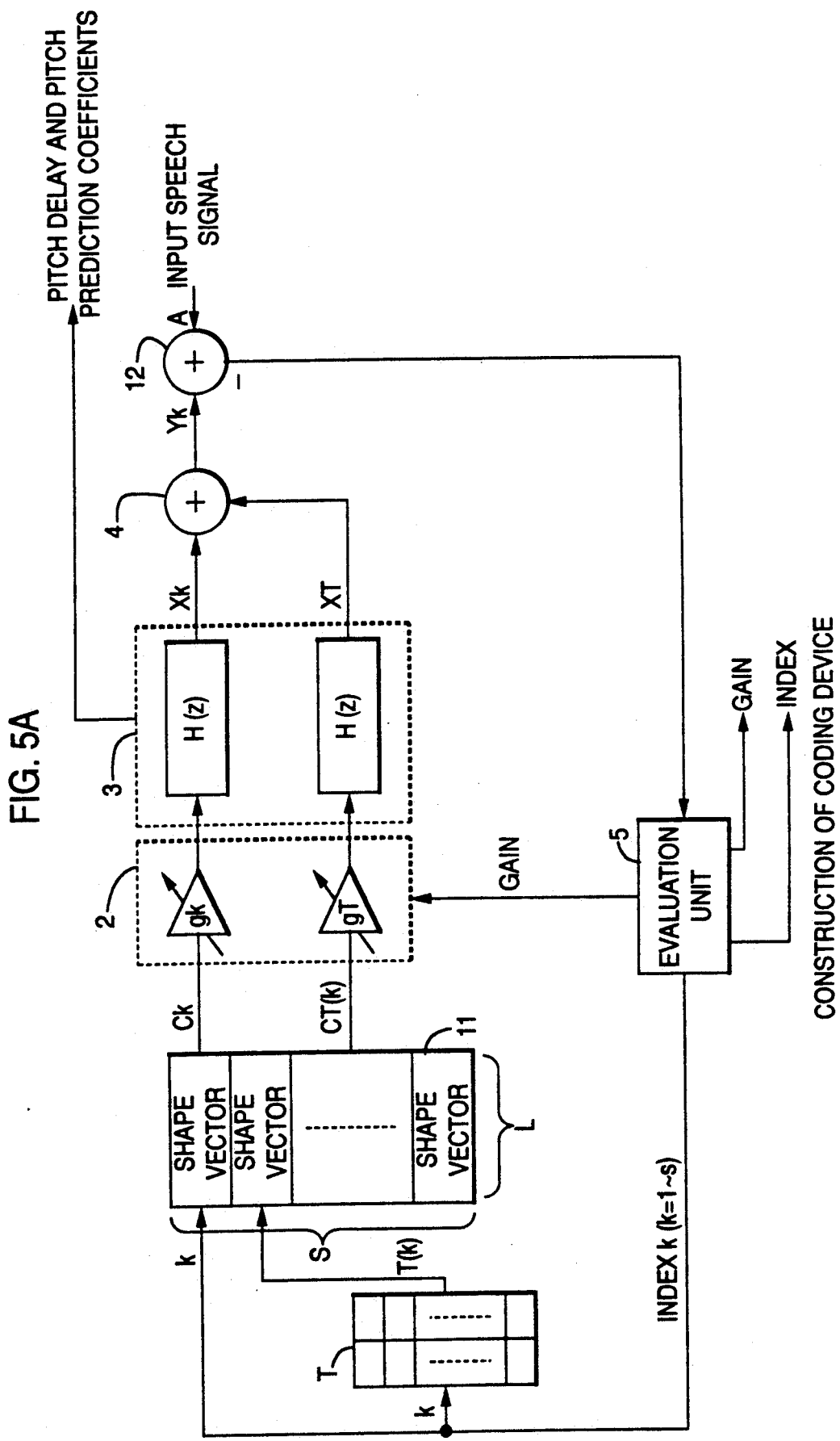
Figure 5B:
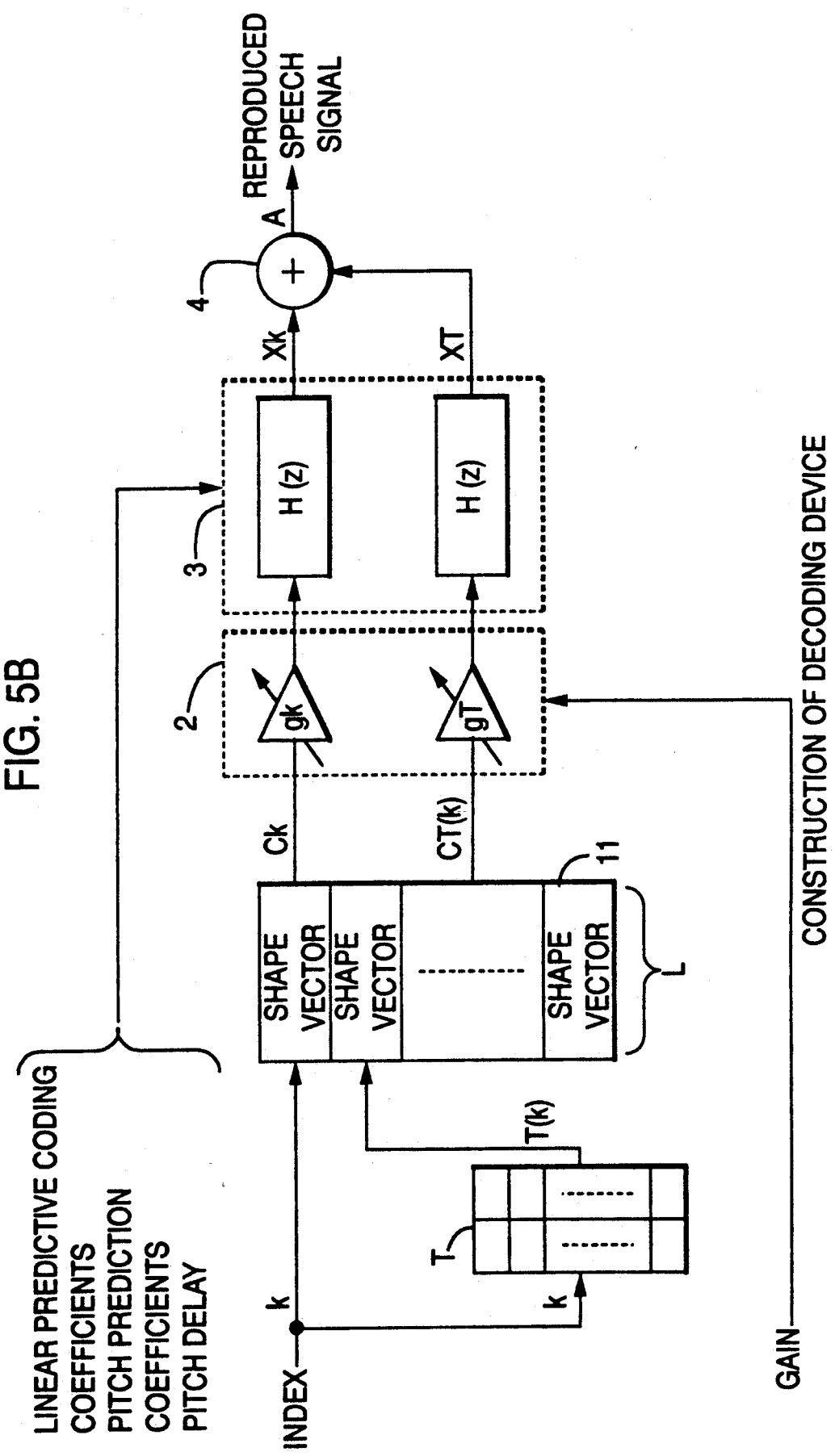

FIGS. 5A and 5B shows a gain-shape vector quantization apparatus based on a system different from the above-mentioned one. That is, FIGS. 5A and 5B show the gain-shape vector quantization apparatus according to another embodiment of the present invention, wherein FIG. 5A shows a coding device and FIG. 5B shows a decoding device.

In the embodiment of FIG. 5A, the code book portion 1 is comprised of a code book which consists of S shape vectors, and a mapping table T which simultaneously selects M (M>1) different shape vectors in response to an index produced from the evaluation unit 5, In FIG. 5A M=2.

As will be obvious from FIGS. 5A and 5B, on either the coding device side or the decoding device side, the code book portion 1 is comprised of a single code book 11 having an L-dimension and a size S, and a mapping table T which generates an index j of a code vector corresponding to a code vector of an index k (k=1, 2, ..., S) (S'≦S), the code vector of the index j being different by one from the code vector of the index k.

$$j = T(k) \quad (5)$$

That is, in response to the index k from the evaluation unit 5, the mapping table T generates a new index T(k) with k as a function, and a plurality of different shape vectors $C_{T(k)}$ are selected in response to the index T(k).

In this embodiment, k and T(k) maintain a suitable functional relationship. For instance, a shape vector which is two in advance may be selected at all times in response to the value k. In this case, T(k) is k+2 with respect to k.

In this embodiment, furthermore, the mapping table T need not be limited to the one that produces a new index T(k) for the index k but may be one that produces a plurality of indexes $T(K_{11})$, $T(K_{12})$ .... In the embodiment of FIG. 5A, reference is made to the mapping table T to find an index j=T(k) for an index k that is transmitted from the evaluation unit 5 on the coding device side or that is transmitted from the coding device side on the decoding device side, and two shape vectors $C_k$, $C_{T(k)}$ are obtained that correspond to the index k.

The shape vectors $C_k$ and $C_{T(k)}$ are multiplied by the gains $g_k$, $g_{T(k)}$, and are input to the synthesis filter 3 to regenerate signal vectors $X_k$, $X_{T(k)}$ of L-dimension.

At this moment, the gains $g_k$ and $g_{T(k)}$ corresponding to the two shape vectors $C_k$, $C_{T(k)}$ are evaluated by the evaluation unit 5 on the coding device side shown in FIG. 5A so as to minimize the distortion scale $D_k$ of the synthesized vector $Y_k$, $$Y_k = g_k \cdot H \cdot C_k + g_{T(k)} \cdot H \cdot C_{T(k)} \quad (6)$$

and the vector A to be quantized.

That is, the evaluation unit 5 uses a Euclidean distance as a distortion scale to find a distortion $D_k$, i.e., $$D_k = |A = Y_k|^2 \quad (7)$$

The distortion $D_k$ is then partially differentiated with $g_k$ and $g_{T(k)}$, and is set to zero, in order to find gain vectors $g_k$ and $g_{T(k)}$ that minimize the distortion $D_k$.

Thus, the distortion $D_k$ is found for each of the indexes k (k=1 to S), and indexes k corresponding to combinations of shape vectors $C_k$, $C_{T(k)}$ that give the smallest distortion are transmitted together with the gain vectors ($g_k$, $g_{T(k)}$).

On the decoding device side shown in FIG. 5B, on the other hand, the mapping table T which is the same as that of the coding device side is referred to by the index k to find an index j=T(k). Then, the code book 11 is referred to by the indexes k and j to obtain shape vectors $C_k$ and $C_{T(k)}$.

Then, the shape vectors are multiplied by the gains $g_k$ and $g_{T(k)}$, pass through the synthesis filter 3, and are added up through the adder 4 to regenerate a voice vector A', i.e., $$A' = g_k \cdot H \cdot C_k + g_{T(k)} \cdot H \cdot C_{T(k)} \qquad (8)$$

In the embodiment shown in FIG. 5A, the index k produced from the evaluation unit 5 is directly input to the code book portion 11 and is further input to the mapping table T to generate a new index T(k). As described above, however, the index k may be input to a plurality of the mapping tables $T_1$, $T_2$, ..., $T_M$ only to generate a plurality of indexes T(k), T(k'), T(k'') from each mapping table.

The embodiment of FIG. 5A has dealt with the case where two indexes were formed from one index. It needs not be pointed out, however, that two or more indexes can be formed by providing a plurality of mapping tables T to realize quantization with less distortion.

In the aforementioned embodiments, the synthesis filters $3_1$ to $3_M$ in the synthesis filter portion 3 may be constituted by a pitch prediction filter 13a to a long-term correlation and an LPC filter 13b to add a short term correlation as shown in FIG. 1.

The synthesis filter portion 3 was provided after the gain circuit portion 2 in the aforementioned two embodiments. It is, however, also allowable to provide the gain circuit portion 2 on the side of the first adder 4 and to provide the synthesis filter portion 3 on the side of the code book portion 1.

Figure 6:
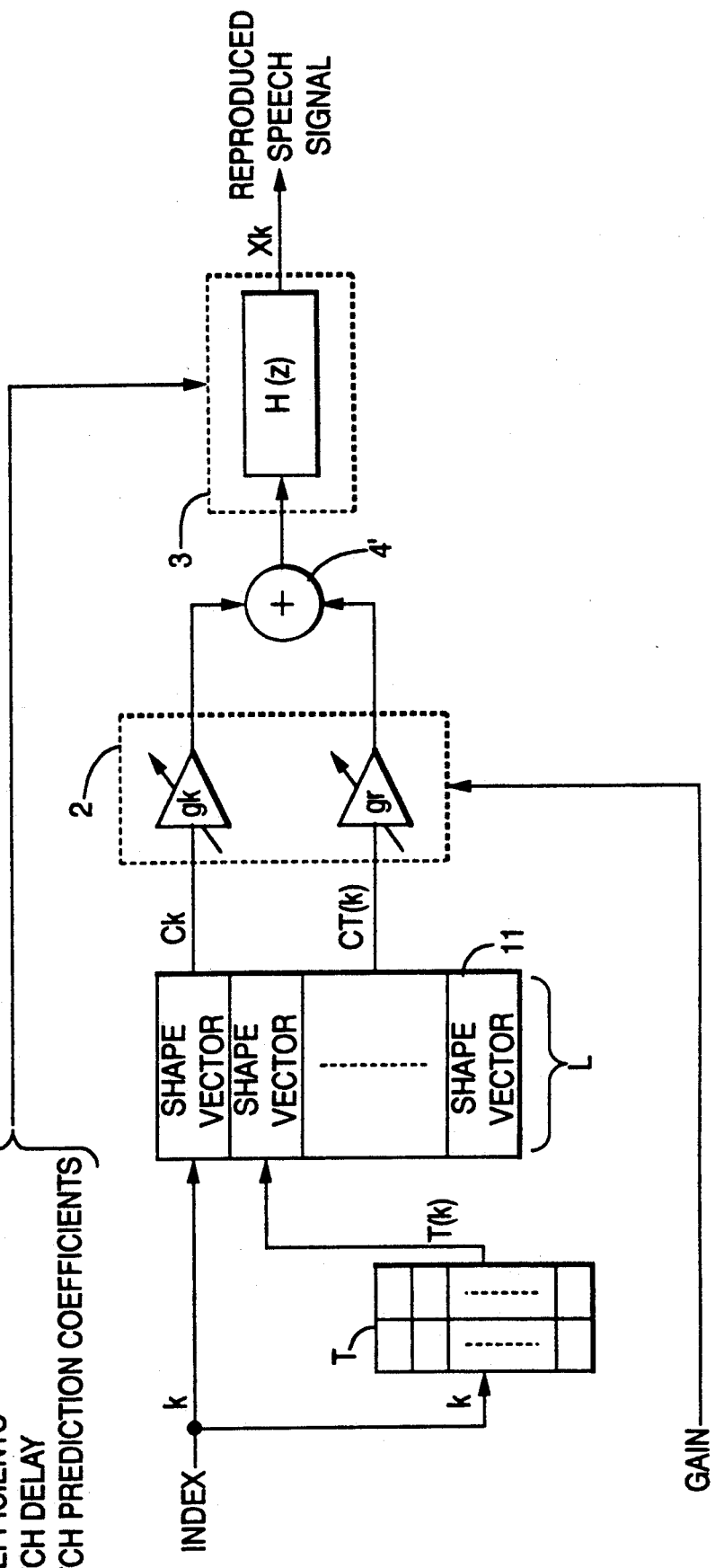
FIG. 6 is a diagram illustrating the construction on the receiving side in the embodiment of FIG. 5A.

As shown in FIG. 6, furthermore, the outputs of the gain circuit portion 2 may be passed through the synthesis filter portion 3 which consists of a synthesis filter 3' after they have been added together through the adder 4' on the receiving side, i.e., on the side of the decoding device in the embodiment of FIG. 5B.

According to the gain-shape vector quantization apparatus of the present invention as described above, a plurality of shape vectors are defined for one index and vectors are quantized using weighted and synthesized vectors, making it possible to decrease the quantization distortion.

Furthermore, by using this multiple vector synthesis technique, it becomes possible to decrease the size of the code book while suppressing the quantization distortion. It is therefore allowed to reduce the memory quantity and the quantity of operation, presenting great advantage for realizing the hardware.

We claim:

1. A gain-shape vector quantization apparatus for an input speech signal, said apparatus comprising:

a code book portion containing a plurality of shape vectors and selecting among the shape vectors upon receipt of an index signal;

a gain circuit portion including a plurality of variable gain circuits coupled in parallel to said code book portion to impart predetermined gains to the shape vectors selected by said code book portion;

a synthesis filter portion including a plurality of synthesis filters coupled in parallel to said gain circuit portion to reproduce signals from the shape vectors as output by said variable gain circuits in said gain circuit portion;

a first adder portion coupled to said synthesis filter portion to add the signals reproduced by said synthesis filters in said synthesis filter portion and to produce an output;

a second adder portion coupled to said first adder portion to add the output of said first adder portion and the input speech signal to determine an error; and an evaluation unit coupled to said second adder and said code book portion to determine the index signal used in the selection of the shape vectors stored in said code book portion to minimize the error between the output of said first adder portion and the input speech signal produced by said second adder portion, and supplied to said code book portion.

2. A gain-shape vector quantization apparatus according to claim 1, wherein said evaluation unit is coupled to said gain circuit portion and supplies gain adjusting signals to each of said variable gain circuits in said gain circuit portion such that the error becomes the smallest.

3. A gain-shape vector quantization apparatus according to claim 1, wherein said code book portion includes a plurality of code book storage units each having a plurality of shape vectors.

4. A gain-shape vector quantization apparatus according to claim 1, wherein said code book portion includes a code book storage unit having a plurality of shape vectors, and a mapping table coupled to said code book storage unit to simultaneously select and produce a plurality of dissimilar shape vectors from said code book storage unit in response to the index signal produced by said evaluation unit.

* * * * *